Aug. 4, 1964 N. M. LOURIE ETAL 3,143,664
SELECTIVE GATE CIRCUIT UTILIZING TRANSFORMERS TO CONTROL THE OPERATION OF A BISTABLE CIRCUIT
Filed Nov. 13, 1961 2 Sheets-Sheet 1

INVENTORS:
Walter Strohmeier
and Norman M. Lourie,
BY Henry L. Hanson
ATTORNEY

INVENTORS:
Walter Strohmeier
and Norman M. Lourie,

BY Henry L. Hanson
ATTORNEY

United States Patent Office 3,143,664

Patented Aug. 4, 1964

3,143,664

SELECTIVE GATE CIRCUIT UTILIZING TRANSFORMERS TO CONTROL THE OPERATION OF A BISTABLE CIRCUIT

Norman M. Lourie, Newton Center, Mass., and Walter Strohmeier, Riehen, near Basel, Switzerland, assignors to Minneapolis-Honeywell Regulator Company, Minneapolis, Minn., a corporation of Delaware Filed Nov. 13, 1961, Ser. No. 151,912

4 Claims. (Cl. 307—88.5)

This invention relates generally to pulse signal manipulating circuits, and more particularly to new and improved pulse signal manipulating circuits of the type adapted to selectively control the operation of a bistable circuit.

Bistable circuits, such as flip-flops or bistable multivibrators and the like, have been widely used in various types of data processing equipment. Such bistable circuits often are referred to as binary flip-flops and are characterized by having two stable states which may be established alternately by the selective application of input pulses. In one known type of binary flip-flop, a pair of inputs are provided so as to be selectively energized by input pulse signals generated at some suitable input pulse signal source for effecting desired circuit functions.

It is a general object of this invention to provide a new and improved pulse signal manipulating circuit for selectively controlling the operation of a bistable flip-flop circuit.

It is a more specific object of this invention to provide a novel current steering circuit which serves to control the operation of a bistable flip-flop circuit in accordance with the presence or absence of gating and input pulse signals.

It is another object of this invention to provide a novel current steering circuit for selectively controlling the operation of a bistable flip-flop which comprises a single source of input pulse signals, and gating signal controlled switching means for selectively steering each input pulse signal into one or the other of two bistable flip-flop inputs so as to maintain the flip-flop in one state or the other in accordance with the presence or absence of gating signals.

It is a further object of this invention to provide a new and improved pulse signal manipulating circuit, as above, which is characterized by its reliability and speed of operation and by its relatively low cost and small number of required components.

The above and other objects of this invention are realized in accordance with a specific illustrative embodiment of the invention which comprises a bistable flip-flop having a pair of inputs adapted to be coupled through separate transformers to a source of input pulse signals. It is a feature of this invention that the coupling transformers are connected in circuit with a voltage responsive switch adapted to be turned on or off in accordance with the selective application of a gating signal. When a gating signal is applied to turn the switch on, the input pulse signal is steered through one transformer to maintain the bistable flip-flop in one operating condition and when a gating signal is not applied to the switch and the latter is off, the input pulse signal is steered through the other transformer to maintain the bistable flip-flop in the other operating condition.

The novel features which are characteristic of the invention are set forth with particularity in the appended claims. The invention itself, however, both as to its organization and method of operation, together with further objects and advantages thereof, will best be understood by reference to the following description taken in conjunction with the accompanying drawings in which:

Figures 1, 2, 3:
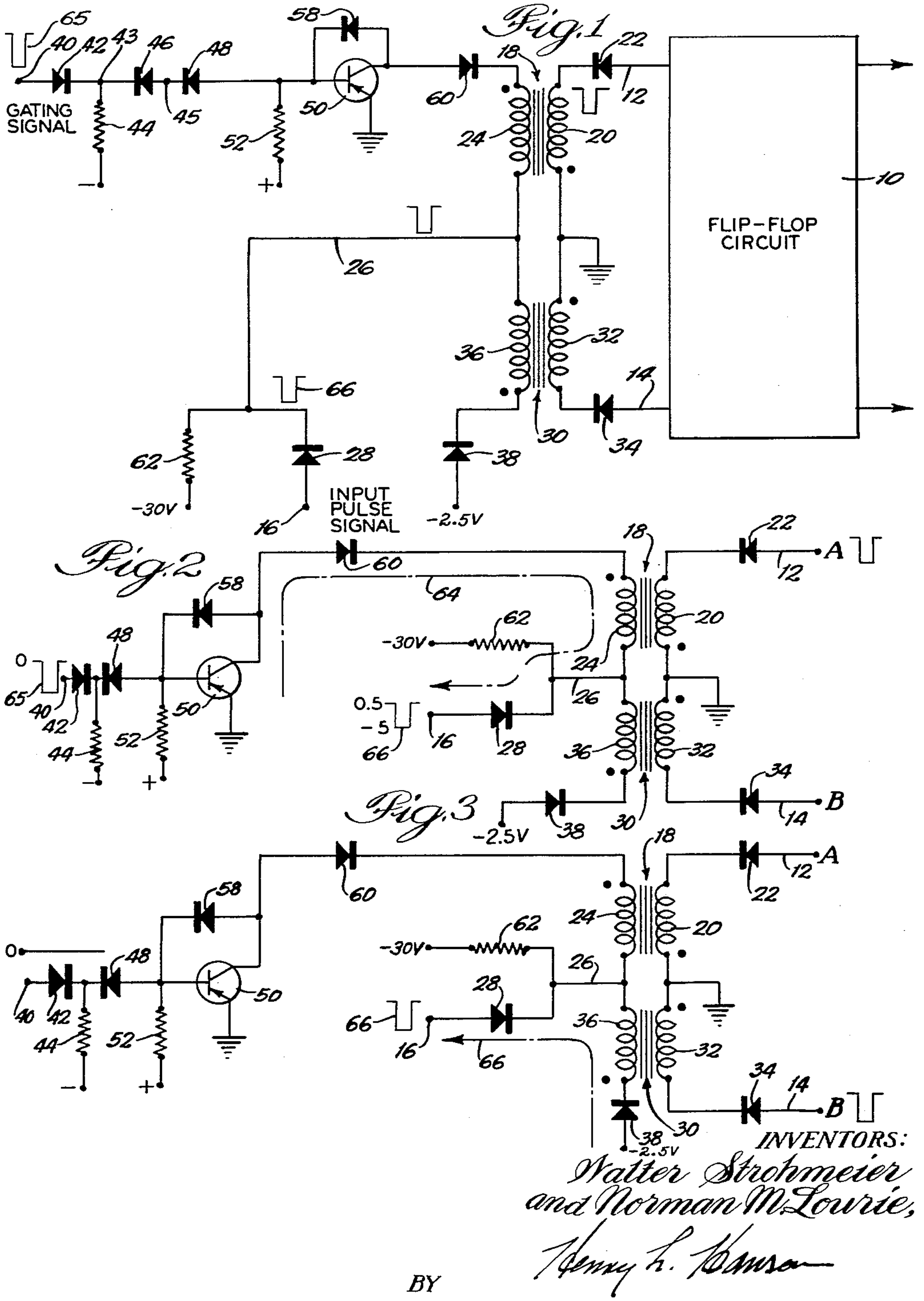
FIGURE 1 is a simplified schematic circuit, partially in block diagram form, illustrating one illustrative embodiment of the invention.
FIGURES 2 and 3 are partial circuit diagrams illustrating the two operating conditions of the invention in accordance with the presence or absence of a gating signal.

Referring now to the drawing, and more particularly to FIGURE 1 thereof, an illustrative embodiment of the present invention is shown in simplified form for the purpose of facilitating the explanation and understanding of its operation. The invention comprises a flip-flop circuit 10 which, as explained hereinabove, may take any well-known form of bistable circuit, such as a bistable multivibrator, a static flip-flop, or the like. The flip-flop circuit 10 is provided with a pair of inputs 12 and 14, respectively, and in accordance with the well-known operation of such a flip-flop circuit, an input signal on the input 12 will maintain the flip-flop circuit in one of its stable states of operation and an input signal on the input 14 will maintain flip-flop circuit in its other stable state of operation.

The input 12 of flip-flop circuit 10 is coupled to a suitable source of input pulse signals at terminal 16 by means of the transformer 18. The secondary winding 20 of transformer 18 is connected through the diode 22 to input 12 while the primary winding 24 of transformer 18 is connected through the lead 26 and the diode 28 to the input pulse signal source terminal 16.

The flip-flop circuit input 14 is coupled to the input pulse signal source by the coupling transformer 30. The secondary winding 32 of transformer 30 is connected to the flip-flop circuit input 14 through the diode 34 while the primary winding 36 of transformer 30 is connected to the input pulse signal source terminal 16 through the lead 26 and the diode 28. The junction of the transformer primary windings 24 and 36 is connected to the input pulse signal lead 26 while the junction of the transformer secondary windings 20 and 32 is connected to ground.

In addition, the primary winding 36 of transformer 30 may be returned to a suitable source of negative voltage, as by means of the diode 38, while the primary winding 24 of transformer 18 may be connected in accordance with a feature of this invention to a voltage responsive transistorized switching circuit adapted to be controlled by a gating signal. The gating or switching circuit comprises a source of gating signals at terminal 40 which is connected through diode 42 to the junction of resistor 44 and diode 46. Resistor 44 is connected to the suitable source of negative voltage and diode 46 is connected through the diode 48 to the base of the transistor switch 50. The base of transistor 50 also is connected to the resistor 52 which is returned to a suitable source of positive voltage. The base of transistor 50 is connected through the diode 58 to the collector of transistor 50, while the emitter of transistor 50 is connected to ground. The collector of transistor 50 also is connected through diode 60 to the primary winding 24 of transformer 18 Additional gating structure may be coupled to the transistor switch 50 so as to perform desired logical functions. As an example, an AND gate may be formed by the addition of diodes to line 43. An OR gate structure may be included by the addition of circuitry to line 45.

The operation of the FIGURE 1 circuit is depicted in FIGURES 2 and 3 of the drawing. For purposes of illustration, let it be assumed that the gate input terminal 40 in FIGURE 2 is initially at ground potential and is then changed to a negative potential, such as −5 volts by means of the gating signal 65. This negative gating signal 65 serves to switch the transistor switch 50 from an "off"

to an "on" condition. This operation is brought about since the transistor 50 is normally held in a current cut-off condition by the positive threshold developed across the diode 48. When the input line 40 goes to −5 volts upon receipt of the gating signal 65, the diode 42 is cut off, and the positive threshold which held transistor 50 normally cut off then is removed to turn transistor 50 "on."

When the next input pulse 66 arrives at the input terminal 16, the diode 28 goes from a positive potential, such as +0.5 volt, to a negative potential, such as −5 volts. Under this condition, current in the resistor 62 flows through the transformer primary winding 24, the diode 60, and the "on" transistor switch 50, in the path indicated by the arrow 64. This current flow develops a negative pulse on the secondary winding 20 of transformer 18 and applies a trigger signal to the flip-flop circuit input 12 to place the flip-flop circuit in one of its operating states. If it should happen that the flip-flop circuit 10 is already in this operating state from a previous trigger signal on input 12, there will be no change of state in the flip-flop circuit; but if the flip-flop circuit 10 is in the other state of operation, as by a previous input pulse on the input 14, then the flip-flop circuit will be triggered to change its state of operation.

If, as illustrated by the circuit of FIGURE 3, there is no gating signal present at the gating input 40, the application of an input pulse signal 66 at terminal 16 will result in the flip-flop circuit being switched to its other state of operation. Thus, with the transistor 50 being switched to its "off" condition by the absence of a gating signal at the gating input terminal 40, there will be no conducting path between the input signal terminal 16 and the gating transistor 50. Under these conditions, an input signal 66 at the input terminal 16 will cause current to flow from the source of negative potential through the diode 38, the primary winding 36 of transformer 30, and then through the doide 28, in the path indicated by the arrow 66. This develops a negative trigger pulse on the secondary winding 32 of transformer 30 to place a trigger signal for the flip-flop circuit on the flip-flop input 14. Thus, it can be appreciated by those skilled in the art that the transformers 18 and 30 in conjunction with the voltage responsive switch or gating transistor 50 serves to steer the input pulse 66 into the selected input of the flip-flop circuit to maintain the flip-flop in one or the other of its two operating states.

Figure 4:
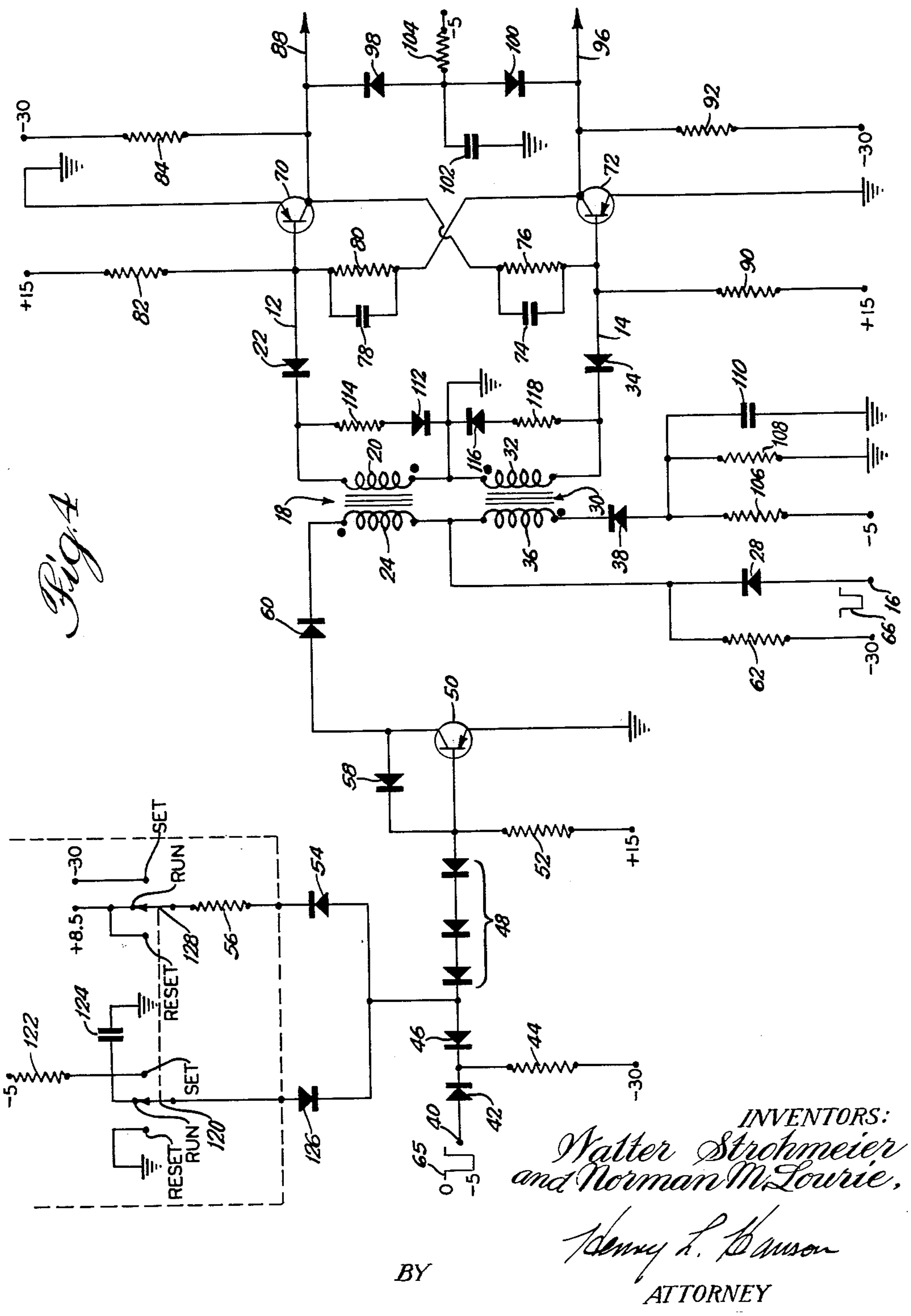
FIGURE 4 is a detailed circuit diagram of one specific embodiment of the invention.

A specific detailed schematic circuit embodying the invention and illustrating typical voltage operating values is shown in FIGURE 4 of the drawing. Many of the components there shown have already been described with respect to FIGURES 1, 2 and 3 discussed hereinabove. FIGURE 4 shows a typical transistorized flip-flop circuit of the type which finds advantageous use in the present invention. This flip-flop circuit comprises a pair of transistors 70 and 72 which are cross-coupled by means of suitable resistance-capacitance networks. Thus, the collector of transistor 70 is connected to the base of transistor 72 by the parallel combination of capacitor 74 and resistance 76. Similarly, the collector of transistor 72 is connected to the base of transistor 70 by the parallel combination of capacitor 78 and resistance 80. The base of transistor 70 is connected to the diode 22 by means of the trigger input lead 12, and also to the resistor 82 which is returned to a source of positive voltage which advantageously may be 15 volts. The emitter of transistor 70 is connected to ground and the collector of transistor 70 is connected through the resistor 84 to a negative voltage source which advantageously may be 30 volts. The collector of transistor 70 also is connected to the flip-flop output line 88.

In a similar fashion, the base of transistor 72 is connected to the diode 34 through the flip-flop input lead 14 and through the resistor 90 to a positive 15 volt voltage source. The emitter of transistor 72 is connected to ground and the collector of transistor 72 is connected through the resistor 92 to a negative 30 volt voltage source.

The collector of transistor 72 is connected to the flip-flop output line 96, and a pair of oppositely pole diodes 98 and 100 are connected in series between the flip-flop output lines 88 and 96. A capacitor 102 is connected between ground and the junction of diodes 98 and 100, and a resistor 104 is connected between a −5 volt source and junction of diodes 98 and 100.

The circuit of FIGURE 4 operates generally in the manner described with respect to FIGURES 1, 2, and 3. Thus, if the gate input terminal 40 is at ground potential before a gating signal is applied, the application of a gating signal makes the gating input go sufficiently negative so as to cut off the diode 42, thereby causing the transistor switch 50 to be turned on. The anode of diode 46 will be at approximately −2.5 volts at this time. When an input signal is applied to the input terminal 16, the anode of diode 28 swings from +0.5 volt to −5 volts. This causes the current flow in resistor 62 to flow through the transformer 18, diode 60, and the "on" transistor switch 50. This current develops a negative pulse on the secondary winding 20 of transformer 18 and triggers transistor 70 in the flip-flop circuit. As explained hereinabove, if transistor 70 is already in an "on" condition, no change of state will result. However, if transistor 70 is in an "off" condition, the input pulse on input lead 12 will turn on transistor 70 and the normal flip-flop regeneration will begin to cause the flip-flop to change its state.

The resulting back voltage on the cathode of diode 28 will be less than −2.5 volts. No current can flow in diode 38 at this time because the voltage divider connected to the anode of diode 38 supplies a minimum of −2.5 volts. This voltage divider is comprised of the resistor 106 and the capacitor 110. The diode 22 in the input lead of transistor 70 disconnects the transformers from the base of transistor 70 during recovery of the transformers. The diode 112 and the resistor 114 across winding 20 of transformer 18 serve to give the correct recovery time constant for the transformer 18.

If it now is assumed that the input signal 65 at the gate input terminal 40 changes back to ground potential before a next input signal 66 appears at input terminal 16, the flip-flop circuit will reset during the next input signal. At this time, the transistor switch or gating circuit 50 is turned off and the common point of transformers 18 and 30 will follow the incoming input signal 66 from terminal 16 until it reaches −2.5 volts. At −2.5 volts, diode 38 starts to conduct, and the current in resistance 62 flows into the primary winding of transformer 30 and diode 38. The resulting negative output pulse on the secondary winding 32 of transformer 30 serves to trigger the transistor 72 which is in the "off" state and the flip-flop regeneration takes place to cause the flip-flop to change its state. Again, if the transistor 72 happened to be "on" at this time, there would be no change of state. The diode 34 serves to disconnect the transistor 72 from the transformer 30 during recovery, and the resistance 118 together with the diode 116 form the recovery network.

In accordance with a further feature of this invention, means are provided to manually set or reset the flip-flop by forcing the input function. This manual switch is shown as comprising the switch blades 120 and 128 which may be selectively placed on either a reset contact, a run contact, or a set contact. The run and set contacts of blade 120 are connected to the junction of resistance 122, which is returned to −5 volts, and capacitance 124 which is returned to ground. The switch blade 120 is connected through the diode 126 to the junction of diodes 46 and 48.

In addition, the reset and run contacts of switch blade 128 are connected together to a +8.5 volt voltage source, while the set contact is connected to a —30 volt source. The switch blade 128 is connected through the resistor 56 and diode 54 to the junction of diodes 46 and 48. In the operation of the manual reset switch, it can be seen that the diodes 126 and 54 serve to disconnect the switch in the run position to eliminate any noise and loading effects.

While there has been shown and described a specific embodiment of the present invention, ti will of course, be understood that various modifications and alternative constructions may be made without departing from the true spirit and scope of the invention. Therefore, it is intended by the appended claims to cover all such modifications and alternative constructions as fall within their true spirit and scope.

What is claimed as the invention is:

1. A pulse signal manipulating circuit for controlling the condition of a bistable circuit in accordance with the presence of gating and input pulse signals comprising a bistable circuit having a pair of inputs adapted to be selectively energized for placing the bistable circuit in a first or second operating state, a pair of transformers, each having primary and secondary windings, said transformer secondary windings being connected respectively to the bistable circuit inputs, and current steering means connected to said transformer primary windings for steering an input pulse signal into a selected bistable circuit input, said current steering means comprising a source of gating signals connected in series with a voltage responsive switch to one transformer primary winding, biasing means connected to the other transformer primary winding, and a source of input pulse signals connected to the junction of the primary windings in a manner such that when the voltage responsive switch is turned on by a gating signal, an input pulse signal is steered through the winding of one transformer to maintain the bistable circuit in a first operating state and when the voltage responsive switch is turned off due to the absence of a gating signal, an input pulse signal is steered through the winding of the other transformer to maintain the bistable circuit in a second operating state.

2. A pulse signal manipulating circuit for controlling the condition of a flip-flop in accordance with the presence of gating and input pulse signals comprising a flip-flop having a pair of inputs adapted to be selectively energized for placing the flip-flop in a first or second operating state, a pair of input circuits connected respectively to the flip-flop inputs, and current steering means connected to said input circuits for steering an input pulse signal into a selected flip-flop input, said current steering means comprising a source of gating signals connected in series with a voltage responsive switch to one input circuit, biasing means connected to the other input circuit, and a source of input pulse signals connected to the junction of the input circuits in a manner such that when the voltage responsive switch is turned on by a gating signal, an input pulse signal is steered through one input circuit to maintain the flip-flop in a first operating state and when the voltage responsive switch is turned off during the absence of a gating signal, an input pulse signal is steered through the other input circuit to maintain the flip-flop in a second operating state.

3. A pulse signal manipulating circuit for controlling the condition of a bistable circuit in accordance with the presence of gating and input pulse signals comprising a bistable circuit having a pair of inputs adapted to be selectively energized for placing the bistable circuit in a first or second operating state, a pair of transformers having their secondary windings connected respectively to the bistable circuit inputs, and current steering means connected to the primary windings of said transformers and responsive to the gating signals for steering an input pulse signal into one bistable circuit input to maintain the bistable circuit in a first operating state when a gating signal is present and for steering an input pulse signal into the other bistable circuit input to maintain the bistable circuit in a second operating state when no gating signal is present, said current steering means comprising a source of gating signals connected in series with a voltage responsive switch and the primary winding of one transformer, biasing means connected in series with the primary winding of the other transformer, and a source of input pulse signals connected to the junction of the primary windings in a manner such that when the voltage responsive switch is turned on by a gating signal, an input pulse signal is steered through the primary winding of one transformer to maintain the bistable circuit in a first operating state and when the voltage responsive switch is turned off due to the absence of a gating signal, an input pulse signal is steered through the primary winding of the other transformer to maintain the bistable circuit in a second operating state.

4. A pulse signal manipulating circuit comprising a bistable circuit having a pair of inputs adapted to be selectively energized for placing the bistable circuit in a first or second operating state, a pair of transformers having their secondary windings connected respectively to the pair of bistable circuit inputs, and current steering means connected to said transformers for steering an input pulse signal into a selected bistable circuit input, said current steering means comprising a source of gating signals connected in series circuit with a normally off transistor switch and the primary winding of one transformer, biasing means connected in series with the primary winding of the other transformer, and a source of input pulse signals connected to the junction of the primary windings of said transformers such that when the transistor switch is turned on by a gating signal, an input pulse signal from said source of input pulse signals is steered through the primary winding of said one transformer to apply a trigger signal to one of said inputs to maintain the bistable circuit in a first operating state and when the transistor switch is turned off due to the absence of a gating signal, an input pulse signal from said source of input pulse signals is steered through the primary winding of the other transformer to apply a trigger signal to the other of said inputs to maintain the bistable circuit in a second operating state.

References Cited in the file of this patent

UNITED STATES PATENTS

| | | |
|---|---|---|
| 2,918,587 | Rector et al. | Dec. 22, 1959 |
| 2,977,485 | Olsen | Mar. 28, 1961 |
| 3,083,304 | Spriestersbach | Mar. 26, 1963 |